United States Patent
Itoh et al.

(10) Patent No.: US 8,175,132 B2
(45) Date of Patent: May 8, 2012

(54) LASER DEVICE AND LASING METHOD

(75) Inventors: Tadashi Itoh, Toyonaka (JP); Masaaki Ashida, Ibaraki (JP)

(73) Assignee: Japan Science and Technology Agency, Saitama (JP)

( * ) Notice: Subject to any disclaimer, the term of this patent is extended or adjusted under 35 U.S.C. 154(b) by 1405 days.

(21) Appl. No.: 10/589,243

(22) PCT Filed: Aug. 11, 2004

(86) PCT No.: PCT/JP2004/011153
§ 371 (c)(1),
(2), (4) Date: May 3, 2007

(87) PCT Pub. No.: WO2005/078881
PCT Pub. Date: Aug. 25, 2005

(65) Prior Publication Data
US 2009/0022192 A1    Jan. 22, 2009

(30) Foreign Application Priority Data
Feb. 13, 2004   (JP) ................................. 2004-037437

(51) Int. Cl.
*H01S 3/09*  (2006.01)
(52) U.S. Cl. .................... 372/69; 372/39; 372/40
(58) Field of Classification Search ............ 372/39, 372/40, 69
See application file for complete search history.

(56) References Cited

U.S. PATENT DOCUMENTS

2002/0196827 A1* 12/2002 Shields et al. ................. 372/45
2003/0218143 A1* 11/2003 Shields et al. ............. 250/493.1

OTHER PUBLICATIONS

The Physical Society of Japan, "Proceedings of the 33$^{rd}$ Annual Meeting vol. 2 (1978)", p. 233, 3p-BG-8, 3p-BG-9.(together with its partial english translation), Yoshiko Nasu, "Research on Excitons and Biexcitons in CuBr", Summary of dissertation for PhD of Tohoku University, and Summary of examination result (PhD conferred on Dec. 24, 1976) (together with its partial English translation).

Japanese Office Action mailed Mar. 3, 2009, for the Japanese Patent Application No. 2004-037437 (with English translation).

International Search Report for PCT/JP2004/011536 dated Sep. 28, 2004 (English and Japanese).

Kagotani et al., *CuCl Ryoshi Dot deno 2-Koshi Kyomei Reiki ni yoru Reikishi Bunshi Jotai kara no Laser Hasshin*, Hikari Bussei Kenkyukai Ronbunshu, 2003, vol. 14, pp. 247-250, with English Abstract.

N.N. Ledenstov et al., Optical properties of heterostructures with InGaAs-GaAs quantum clusters:, Semiconductors 28(8), Aug. 1994, pp. 832-834.

A.V. Malko et al., From amplified spontaneous emission to microring lasing using nanocrystal quantum dot solids, Applied Physics Letters 81(7), Aug. 2002, pp. 1303-1305.

Y. Masumoto et al., Biexciton lasing CuCl quantum dots, Appl. Physc. Lett. 62(3), Jan. 1993, pp. 225-227.

* cited by examiner

*Primary Examiner* — Yuanda Zhang
(74) *Attorney, Agent, or Firm* — Nixon & Vanderhye PC

(57) ABSTRACT

A laser device which causes lasing with a use of a semiconductor quantum dot is provided with: a laser member (11) in which the semiconductor quantum dot is formed; a resonator (14) for resonating light generated in the laser member (11); and a pump laser (15) for irradiating the laser member (11) with excitation light whose energy corresponds to two-photon resonant excitation, so as to form a biexciton state in the semiconductor quantum dot by the two-photon resonant excitation. In this way, a laser device which enables lasing using efficient light emission is realized.

9 Claims, 16 Drawing Sheets

F I G. 1
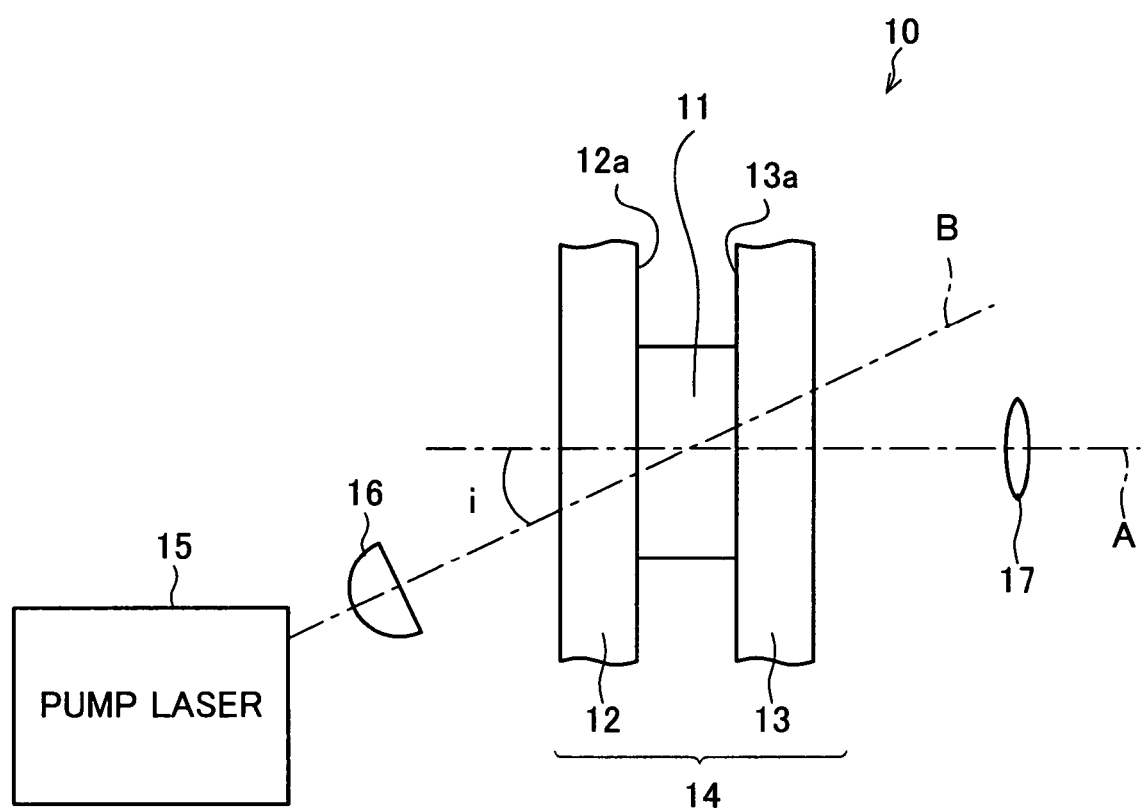

F I G. 2(a)
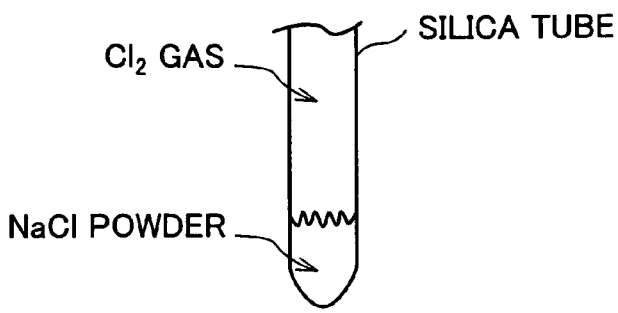
F I G. 2(b)
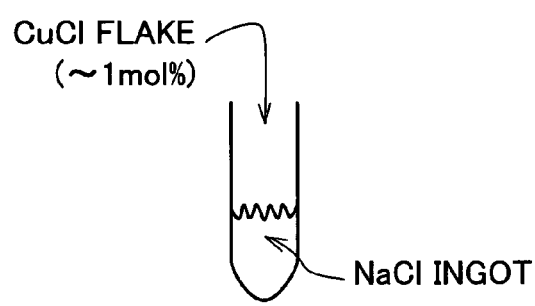
F I G. 2(c)
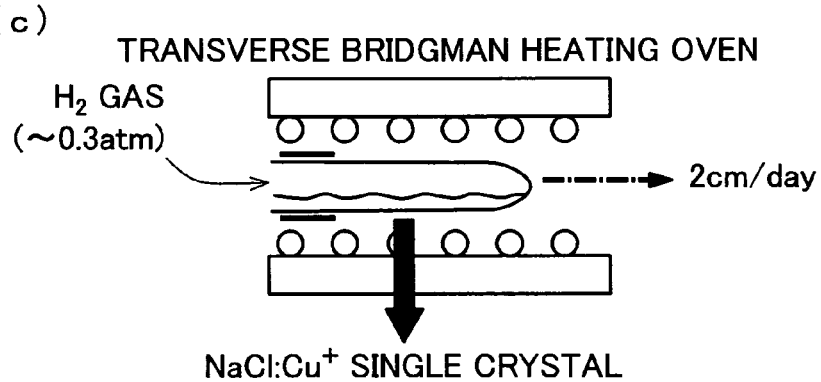
F I G. 2(d)
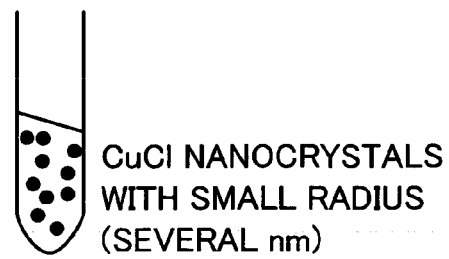
F I G. 2(e)
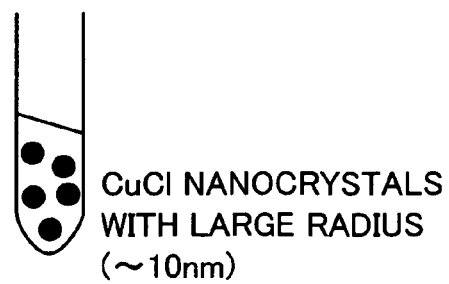

M : BIEXCITON
BM : BOUND BIEXCITON
X : EXCITON
BX : BOUND EXCITON

F I G. 6
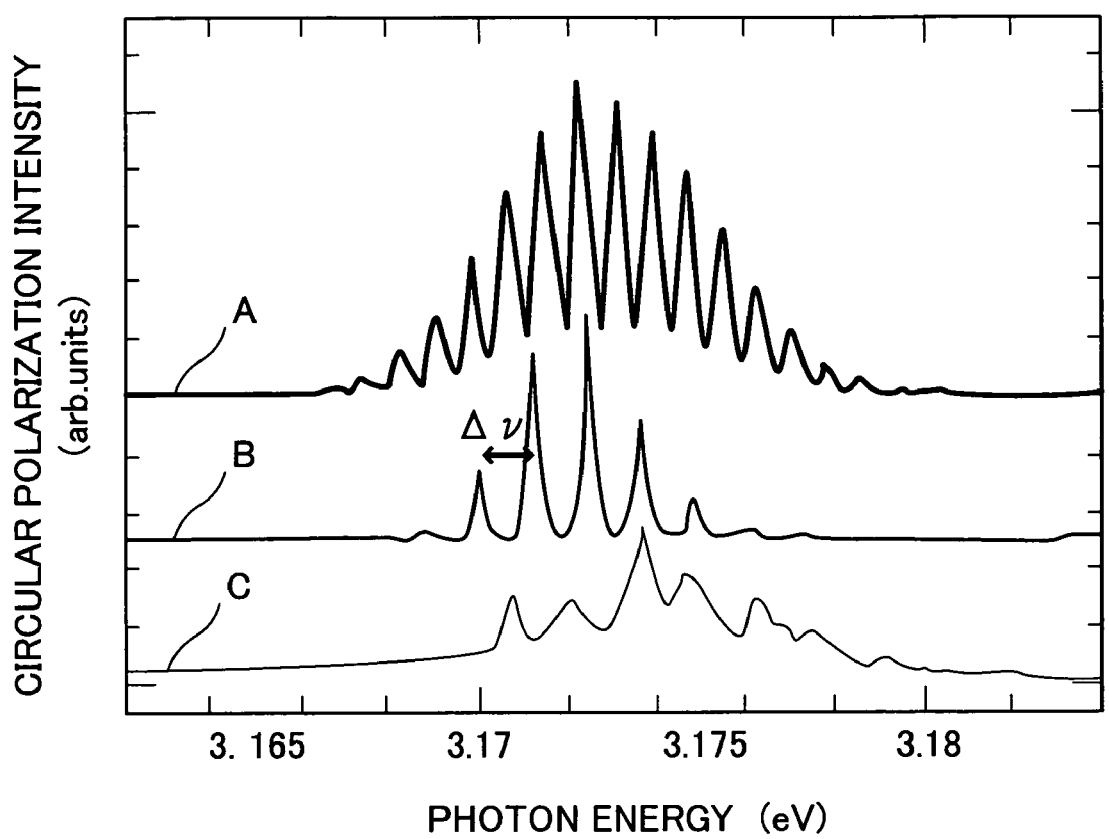

F I G. 7

| SAMPLE | MODE DISTANCE $\Delta \nu$ | CALCULATED CRYSTAL THICKNESS(mm) | ACTUALLY MEASURED CRYSTAL THICKNESS(mm) |
|---|---|---|---|
| A | $1.980 \times 10^{11} s^{-1}$ | 0.48 | 0.46 |
| B | $2.942 \times 10^{11} s^{-1}$ | 0.32 | 0.30 |
| C | $3.215 \times 10^{11} s^{-1}$ | 0.29 | 0.27 |

F I G. 8
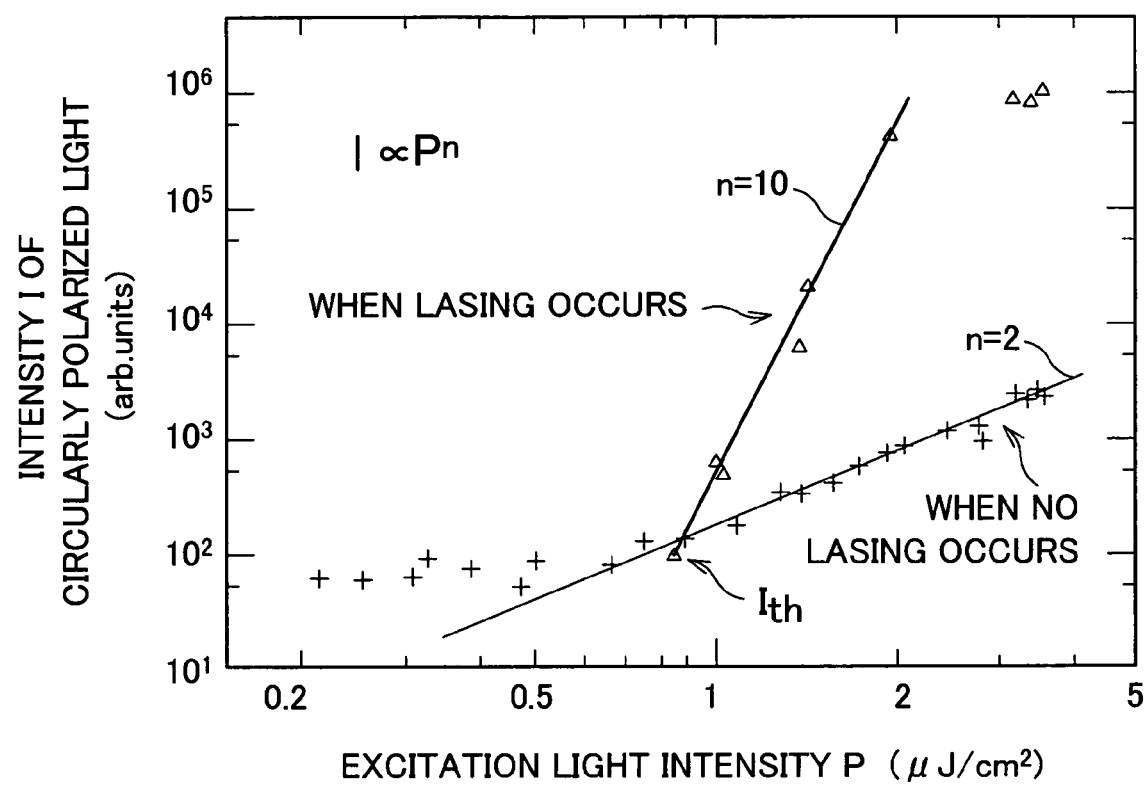

F I G. 9(a)
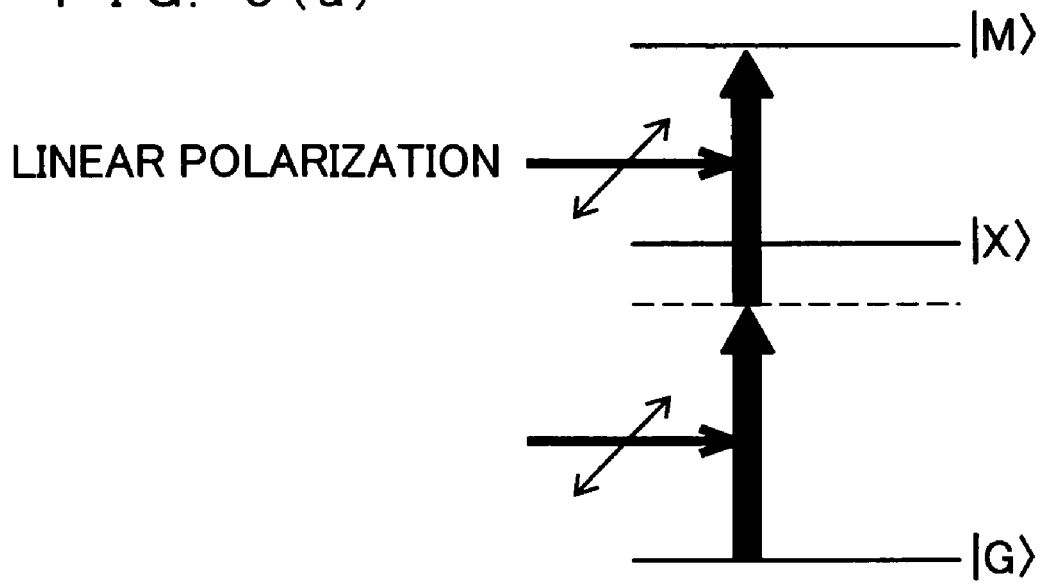
F I G. 9(b)
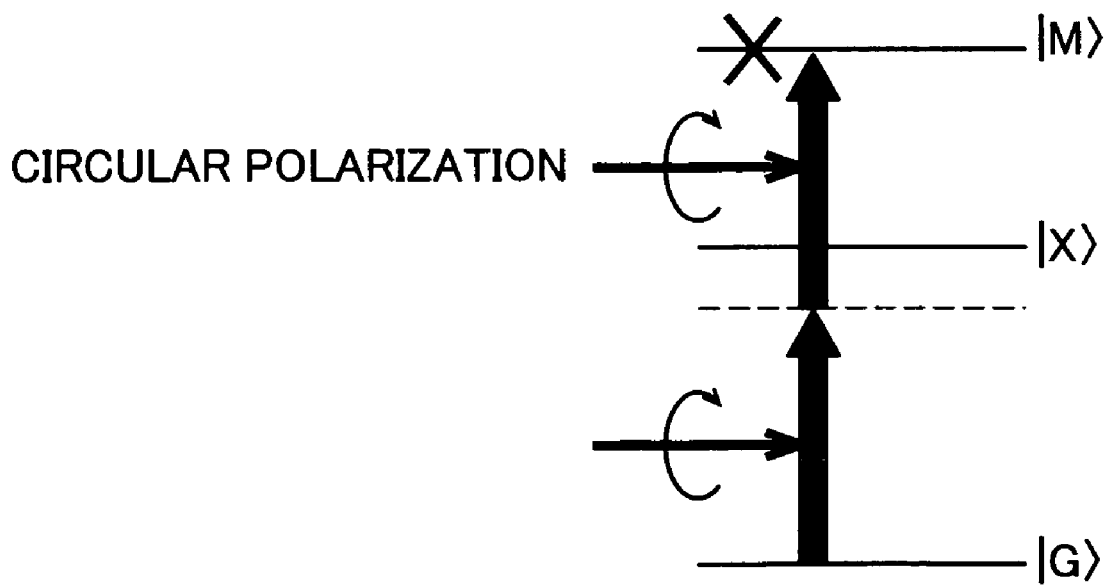

F I G. 1 1
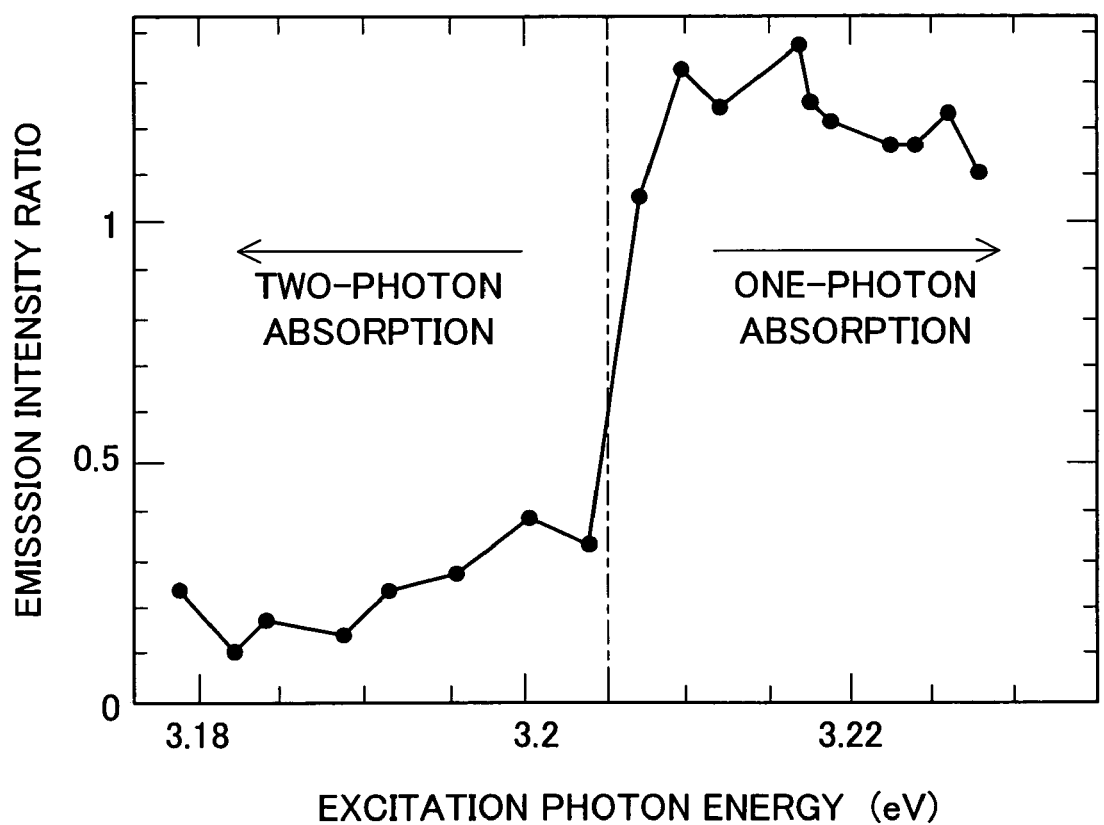

FIG. 12

| | EXAMPLE | CONVENTIONAL ART |
|---|---|---|
| PHOTON ENERGY OF EXCITATION LASER LIGHT (WAVELENGTH OF EXCITATION LASER LIGHT) | 3.1950eV (389nm) | 3.68eV (337nm) |
| PULSE WIDTH OF EXCITATION LASER LIGHT | (1) PICOSECOND (1.5ps) (2) FEMTOSECOND (200fs) | NANOSECOND (10ns/20ns) |
| EXCITATION MODE | TWO-PHOTON RESONANT EXCITATION OF BIEXCITONS | BAND-TO-BAND EXCITATION |
| RESONATOR | NaCl CLEAVED SURFACE | DIELECTRIC MIRROR |
| REFLECTANCE R OF RESONATOR | 5% | 90% |
| Q-FACTOR | 13,400 | 128,000 |
| LASING THRESHOLD VALUE $I_{th}$ | (1) 67MW/cm$^2$ (100 $\mu$ J/cm$^2$) (2) 7.5MW/cm$^2$ (1.5 $\mu$ J/cm$^2$) | 2.1MW/cm$^2$ (21mJ/cm$^2$) |

M : BIEXCITON
BM : BOUND BIEXCITON
X : EXCITON
BX : BOUND EXCITON

F I G. 1 5 (a)
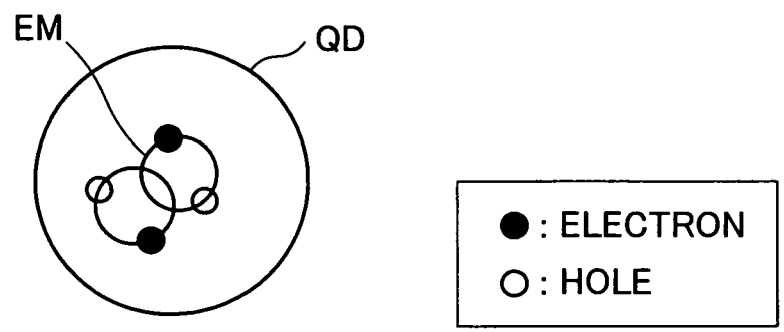
F I G. 1 5 (b)
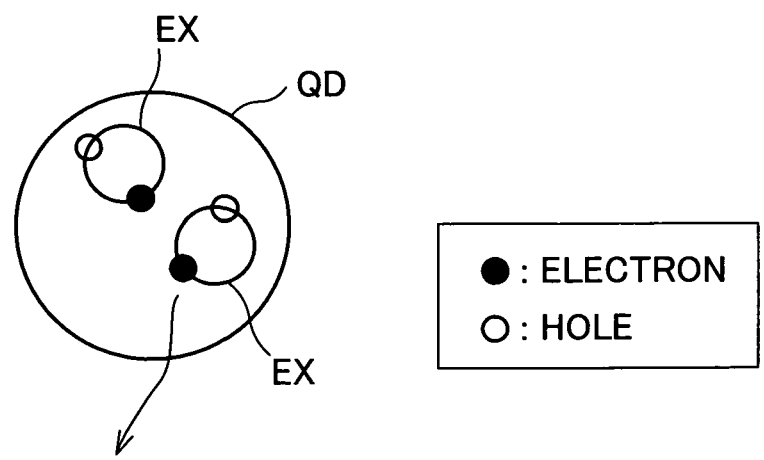

F I G. 1 6 (a)
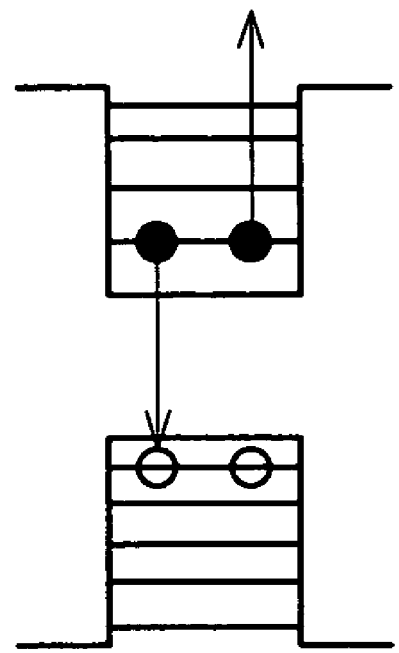
F I G. 1 6 (b)
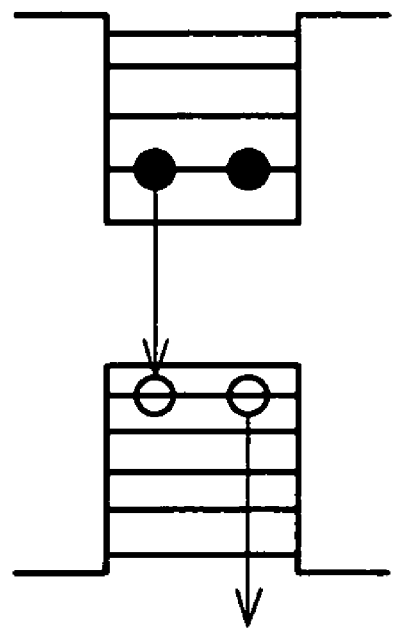

PRIOR ART

PRIOR ART

LASER DEVICE AND LASING METHOD

This application is the US national phase of international application PCT/JP2004/011536 filed 11 Aug. 2004, which designated the U.S. and claims priority of JP 2004-037437, dated 13 Feb. 2004, the entire contents of each of which are hereby incorporated by reference.

TECHNICAL FIELD

The present invention relates to a laser device and a lasing method, each of which causes lasing with a use of semiconductor quantum dots.

BACKGROUND ART

Zero dimension semiconductors so-called semiconductor quantum dots causes a remarkable change in characteristics of electrons, in size quantization of a solid object, compared to a quantum well or a quantum wire. In a system in which a carrier is three-dimensionally confined, electron energy levels are discrete in a delta-functional manner, which consequently causes centralization of state density.

Since such characteristics are expressed, a use of semiconductor dots as a laser medium is advantageous in (i) achieving a low lasing threshold, and (ii) improving lasing efficiency by centralizing gain spectra in a narrower region than a bulk material.

These advantages are proved by an epitaxial-grown self-generated quantum dot laser (e.g. See "Semiconductors 28" 832 (1994); N. N. Ledentsov, V. M. Ustinov, A. Y. Egorov, et. al.). In response to the success of lasing by the epitaxial quantum dots, there is an increasing expectation in development of laser using collide or nanocrystal quantum dot of approximately 10 nm or less, which quantum dot expresses quantum size effect.

Particularly, CdSe nanocrystal is one amongst those most frequently studied as a laser medium and as a nanocrystal which exhibit strong quantum confinement. The luminescent spectra of CdSe nanocrystal easily allows varying of colors in the visible band, and allows relatively easy synthesis.

For example, minute ring lasing of Whispering Gallery Mode using nanocrystals put in a minute tube is a known research on lasing from CdSe nanocrystal (e.g. See Phys. Lett 81, 1303 (2002), A. V. Malko, A. A. Mikhailovsky, M. A. Petruska, ppl.).

Further, for example, lasing from CuCl nanocrystals is known as lasing from nanocrystal quantum dots, beside the lasing from CdSe nanocrystals (e.g. see Appl. Phys. Lett. 62, 225 (1993), Y. Masumoto, T. Kawamura, K. Era).

FIG. 17 illustrates a configuration of laser 100 used in lasing described in the "Appl. Phys. Lett. 62". This laser 100 includes: a sample 101 which is NaCl crystal into which CuCl nano crystals are embedded; and two-dielectric mirrors 102 serving as a resonator.

The effective mean radius of CuCl nanocrystals in the sample 101 is 5.0 nm, and the external dimension of the NaCl crystal is 3.2×5.6×0.58 mm$^3$. The dielectric mirrors 102 have reflection surfaces 102a of 90% in reflectance. These dielectric mirrors 102 are arranged so that the reflection surfaces 102a are in parallel to each other, and that these reflection surfaces 102a interposes therebetween the sample 101 in its thickness direction (in the direction of the thickness of 0.58 mm).

In Appl. Phys. Lett. 62, lasing is confirmed by irradiating the laser 100, which is cooled to 77K, with nitrogen laser light of 337 nm in wavelength at a pulse width of 10 ns. In this lasing, the lasing threshold value $I_{th}$ in relation to energy density of the nitrogen laser light irradiated is 2.1 MW/cm$^2$.

FIG. 18 shows emission intensity of before and after the lasing threshold. The dotted line shows the emission intensity of a case where the energy density is 0.86 $I_{th}$, and the solid line shows the emission intensity in a case where the energy density is 1.08 $I_{th}$.

In the lasing disclosed in Appl. Phys. Lett. 62, an exciton absorption band is excited. As such, a large number of excitons are generated, and biexcitons are generated as the result of interaction amongst the excitons. In this process, ionization of the semiconductor quantum dots, so-called Auger process, occurs. Since Auger process is a nonradiation process, it causes a loss of the excitation energy without light emission. Accordingly, the above lasing is disadvantageous in that light emission efficiency is significantly reduced, and that the lasing threshold value increases.

The present invention is made in view of the above described problems, and it is an object of the present invention to provide a laser device and a lasing method which realize lasing utilizing an efficient light emitting phenomena.

DISCLOSURE OF INVENTION

In order to solve the foregoing problems, a laser device of the present invention is a laser device for causing lasing by using a semiconductor quantum dot, including: a laser member in which said semiconductor quantum dot is formed; a resonating section for resonating light generated in the laser member; and an excitation light source section for irradiating the laser member with excitation light whose energy corresponds to two-photon resonant excitation, so as to form a biexciton state in the semiconductor quantum dot by the two-photon resonant excitation.

Further, in order to solve the foregoing problems, a lasing method of the present invention is a lasing method which causes lasing by using a semiconductor quantum dot, including the step of: forming a biexciton state in the semiconductor quantum dot by two-photon resonant excitation, so as to cause lasing by inducing light emission from the semiconductor quantum dot. The biexciton state is formed by the two-photon resonant excitation in the semiconductor quantum dots, by irradiating the semiconductor quantum dot with the excitation light whose energy corresponding to the two-photon resonant excitation.

In the above configuration and the method, the biexciton state is formed in the semiconductor quantum dot, so as to cause lasing by inducing light emission. Further, the excitation by two-photon resonant excitation (two-photon resonant excitation of biexcitons) is performed to form the biexciton state.

The formation of the biexciton state by the two-photon resonant excitation of biexcitons restrains Auger process (i.e. nonradiation process) which occurs in excitation of an exciton absorption band or in one-photon excitation of excitons.

As such, a larger number of biexcitons contributes to the light emission. As the result, it is possible to realize lasing which utilizes efficient light emission.

The laser device or the lasing method of the present invention is preferably adapted so that a continuous irradiation period of the excitation light is of the order of picoseconds or femtoseconds.

The decay time of biexcitons is of the order of several tens picoseconds. Therefore, by regulating the continuous irradiation period of the excitation light as described above, almost only the excitation takes place in the continuous irradiation period. This allows biexcitons to be generated at once, and allows easy realization of complete population inversion. The reason for this is as follows. Namely, the decay time of an exciton, which time occurs in the process of light emission from biexciton, is longer than that of biexciton, and the decay time of the exciton is approximately several hundreds pico seconds. Therefore, an irradiation period which is longer than one nanosecond causes energy reabsorption which causes the exciton state to become the initial state, and causes a transition from the exciton state to the biexciton state. Accordingly, it is possible to more efficiently realize two-photon resonant excitation of biexcitons. This also allows reduction of the lasing threshold value consequently.

Note that the above regulation of the continuous irradiation period is possible by modulating excitation light to be irradiated into excitation light of picosecond pulse or femtosecond pulse excitation light.

The laser device of the present invention may be adapted so that: said laser member includes the semiconductor quantum dot and a base material retaining the semiconductor quantum dot; said semiconductor quantum dot is made of any one of CuCl, CuBr, CdSe, CdS; and said base material is made of glass or alkali halide crystal.

Alternatively, the laser device of the present invention may be adapted so that: said laser member includes the semiconductor quantum dot and a base material retaining the semiconductor quantum dot; said semiconductor quantum dot is made of InAs or InGaSb; and said base material is made of GaAs.

Additional objects, features, and strengths of the present invention will be made clear by the description below. Further, the advantages of the present invention will be evident from the following explanation in reference to the drawings.

BRIEF DESCRIPTION OF DRAWINGS

FIG. 1 is a plane view illustrating a configuration of laser of an embodiment of the present invention.

FIG. 2(a) to FIG. 2(e) are diagram illustrating a process in a fabrication method of a laser member in the laser.

FIG. 6 is a graph showing another observation result of the observation of light emission, which experiment conducted using the laser members fabricated in the example of the present invention.

FIG. 7 is a table showing a result of measuring the thickness of samples from which the observation result of FIG. 5 is obtained.

FIG. 8 is a graph showing a relationship between excitation intensity and emission intensity in a portion where lasing occurred, and a portion where no lasing occurred.

FIG. 9(a) is an energy band diagram showing excitation by linearly polarized light, and FIG. 9(b) is an energy band diagram showing excitation by circularly polarized light.

FIG. 11 is a graph in which actually measured values are plotted, where: the vertical axis is a emission intensity ratio of a case of using linearly polarized excitation laser light and a case of using circularly polarized excitation light; and the horizontal axis is a variation in photon energy of the excitation laser light.

FIG. 12 is a diagram for comparing the embodiment of the present invention with a conventional art.

FIG. 15(a) is a diagram illustrating a biexciton formed in a semiconductor quantum dot, and FIG. 15(b) is a diagram illustrating two excitons formed in the semiconductor quantum dot.

FIG. 16(a) and FIG. 16(b) are energy band diagrams showing how a semiconductor quantum dots are ionized through a nonradiation process.

BEST MODE FOR CARRYING OUT THE INVENTION

Figure 3:
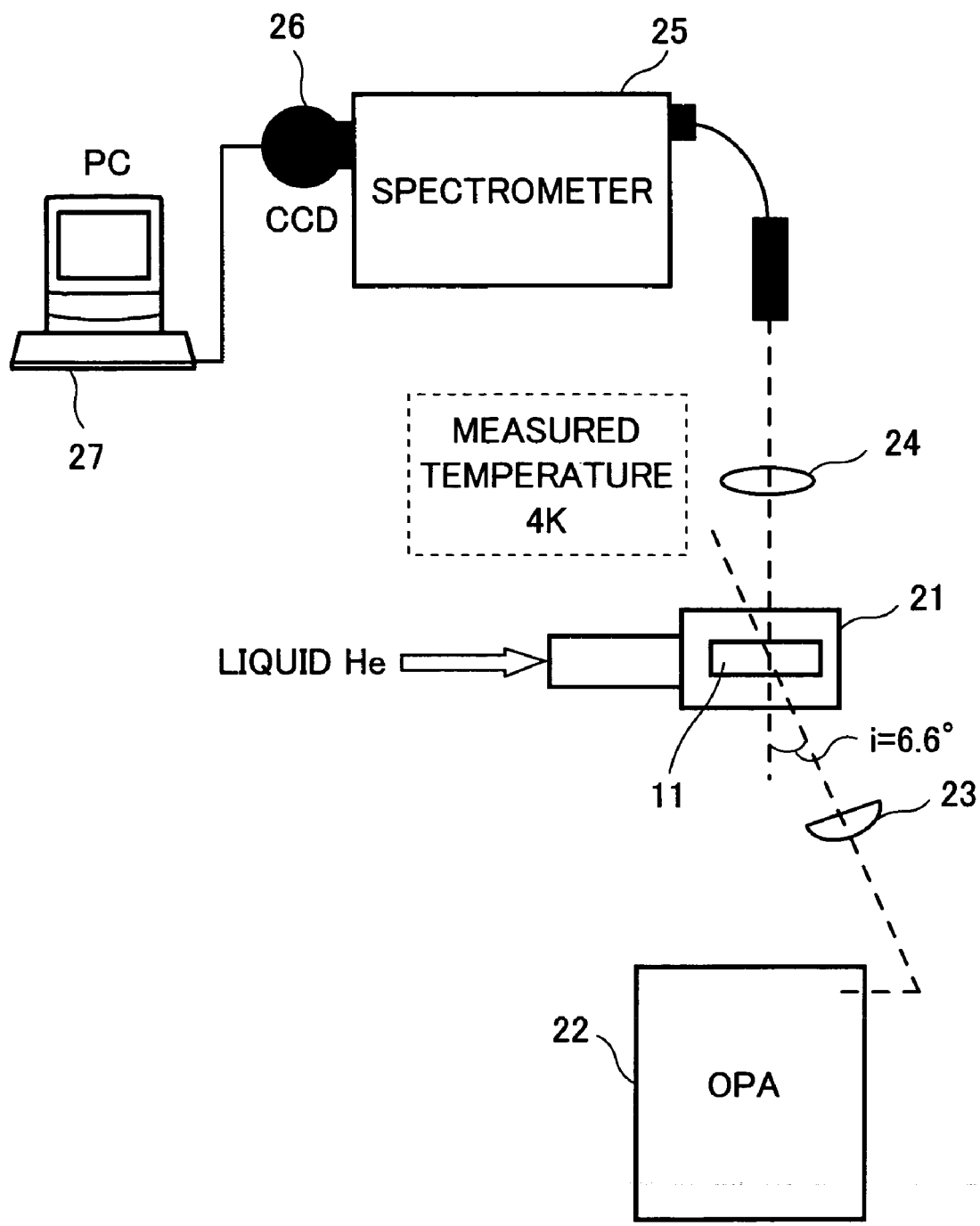
FIG. 3 is a diagram illustrating a configuration of a device used in an observation of light emission, which experiment conducted using the laser members fabricated in an example of the present invention.

The following examples, Comparison Examples, alternative forms, and application examples are for providing detailed description of the present invention, and are not at all intended to limit the scope of the present invention.

The following describes an embodiment of the present invention, with reference to the drawings attached hereto.

FIG. 1 illustrates a laser 10 of the present embodiment. The laser 10 includes: a laser member 11; a resonator 14 serving as a resonating member which resonates light generated in the laser member 11; a pump laser 15 serving as an excitation light source member which irradiate the laser member 11 with excitation light; a condensing lens 16; and an emission-side lens 17.

The laser member 11 includes a base material and semiconductor quantum dots embedded in the base material. This laser member 11 is in a shape of parallel plate having a predetermined thickness. For example, the base material is NaCl crystal, and the semiconductor quantum dots are CuCl nanocrystals.

The resonator 14 includes two reflection mirrors 12 and 13 respectively having reflection surfaces 12a and 13a. These reflection mirrors 12 and 13 are arranged in such a manner that the reflection surfaces 12a and 13a interposes therebetween the laser member 11 in its thickness direction. Further, each of the reflection mirrors 12 and 13 are configured by, for example, a dielectric mirror. Here, the thickness direction of the laser member 11 is a normal direction A of parallel surfaces of the shape of the parallel plate. These parallel surfaces are "end surfaces" of the laser member 11, and the reflection surfaces 12a and 13a of the reflection mirrors 12 and 13 are closely attached to these end surfaces.

The pump laser 15 is for generating excitation laser light for causing lasing in the semiconductor quantum dots of the laser member 11. The present invention employs, as the excitation laser light, laser light which causes lasing by two-photon resonant excitation of biexcitons in the semiconductor quantum dots of the laser member 11, and the pump laser 15 generates such laser light.

Here, the two-photon resonant excitation of biexcitons is as follows. Biexcitons are generated by generating a large number of excitons. However, the biexcitons can be directly generated, without the intermediary of the excitons. This is achieved with a use of excitation laser light whose energy is equivalent to half of the energy gap between (i) a ground state ($|G>$ of FIG. 5 described later) and (ii) an biexciton state ($|M>$ of FIG. 5). Two photons (two-photon) having this energy allow the transition to the biexciton state. Note that the biexciton state has an energy that is lower than the energy of two free excitons ($|2X>$ of FIG. 14) by an amount of a binding energy. In this direct generation of the biexcitons, the expression probability is reinforced by a phenomenon called "giant two-photon absorption".

The condensing lens 16 is for condensing the laser light emitted by the pump laser 15, and for irradiating the laser member 11 with the laser light. Further, the emission-side lens 17 is for condensing the laser light having emitted by the lasing in the laser member 11.

An optical axis of the laser light emitted from the pump laser 15 extends in a direction B, and the axis intersects, at an incident angle i, with the normal direction A, nearby the center of the laser member 11.

EXAMPLE

Next the following deals with various experiments in relation to the embodiment of the above described laser 10.

The laser member 11 was made as follows. Namely, the CuCl nanocrystals serving as the semiconductor quantum dots were embedded into the base material made of NaCl crystal. This base material was cleaved into a parallel plate-like shape of 0.2 to 0.5 mm in thickness. Here, the effective mean radius of the CuCl nanocrystals were approximately 6 nm, and the concentration of the CuCl nanocrystals in the NaCl crystal was approximately 1 mol %. As such, the CuCl nanocrystals in the NaCl crystal were assumed to be at least 100 nm apart from one another. Furthermore, each of CuCl nanocrystals was assumed to have a cubic shape.

The CuCl nanocrystals were adopted as the semiconductor quantum dots, on the ground that CuCl has large exciton binding energy of 197 meV, and the states of an exciton and a biexciton thereof at a low temperature are relatively stable.

FIGS. 2(a) to 2(e) illustrates an exemplary fabrication process of the laser member 11. Transverse Bridgman method was adopted as a method for fabricating the laser member 11. First, as illustrated in FIG. 2(a), NaCl powder was put in a silica tube, and chlorine gas was filled in. Then, the NaCl was melted by heating it to approximately 820° C. After that, as illustrated in FIG. 2(b), approximately 1 mol % of CuCl flake was added to the melted NaCl, and the mixture was cooled down. Thus, an ingot of the NaCl was obtained. Next, as illustrated in FIG. 2(c), approximately 0.3 atm of hydrogen gas was filled into the silica tube, and the tube was transferred through a transverse Bridgman heating oven at the speed of 2 cm/day. Through this process, NaCl: $Cu^+$ single crystal was obtained. By annealing the NaCl: $Cu^+$ for several hours at a temperature in a range of 500° C. to 600° C., CuCl nanocrystals with effective mean radius of several nm were obtained in the NaCl crystal, as illustrated in FIG. 2(d). By further annealing at a temperature in a range of 200° C. to 300° C., the effective mean radius of CuCl nanocrystals increased to 10 nm, as illustrated in FIG. 2(e). On the other hand, the effective mean radius of the CuCl nanocrystals decreases to the several nm as illustrated in FIG. 2(d), if the annealing is carried out at a temperature in a range between 500° C. to 600° C., after the nanocrystals have grown to the nanocrystals with the means effective radius of 10 nm. As described, the size of the CuCl nanocrystals is controlled by the annealing process. In the present example, the effective mean radius of the CuCl nanocrystals was 6 nm, as described above.

In the present example, the reflection mirrors 12 and 13 serving as the resonator 14 were omitted, and cleavage surfaces (i.e. end surfaces) of the laser member 11, each having reflectance of approximately 5% were used as a resonator.

FIG. 3 illustrates a configuration of an experimental apparatus used for observing light emission by the above described laser member 11. The experimental apparatus includes a cryostat 21 which uses Helium as its cryogen, and a laser member 11 is fixed in this cryostat 21 by using a copper-made holder. Further, a wavelength-variable laser OPA (Optical Parametric Amplifier) 22, which corresponds to the pump laser 15, was used for generating excitation laser light. The laser member 11 in the cryostat 21 was irradiated with this excitation laser light via a condensing lens 23 corresponding to the condensing lens 16.

Further, light emitted from the laser member 11 was lead to a spectrometer 25 via a condensing lens 24 which corresponds to the emission-side lens 17. The resulting spectrum from the spectrometer 25 was then detected by the CCD (Charge Coupled Device) 26, and was analyzed by a PC (Personal Computer) 27.

To date, the inventors have found from their research that two-photon resonance absorption bands of biexcitons are distributed in the semiconductor quantum dots, and confirmed that the two-photon resonance absorption bands of biexcitons exist in a lower position than a position of an exciton resonance energy of the bulk. In view of that, an experiment of intensive excitation by two-photon resonant excitation of biexcitons was conducted.

Specific conditions for the experiment were as follows. Namely, the temperature of the laser member 11 during the experiment was set at 4K, and the incident angle i at which the excitation laser is incident was set at 6.6°. The excitation laser light used was a fourth harmonic wave of a pico-second laser light (1.5 pico-second in pulse width; 3.1950 eV in photon energy; 3.3 meV in spectral width; and 1.0 kHz in repetition rate). The photon energy was tuned to a photon energy for causing the two-photon resonant excitation of biexcitons. Through this experiment, light emission from the laser member 11 due to the two-photon resonant excitation of biexcitons was observed.

Figure 4:
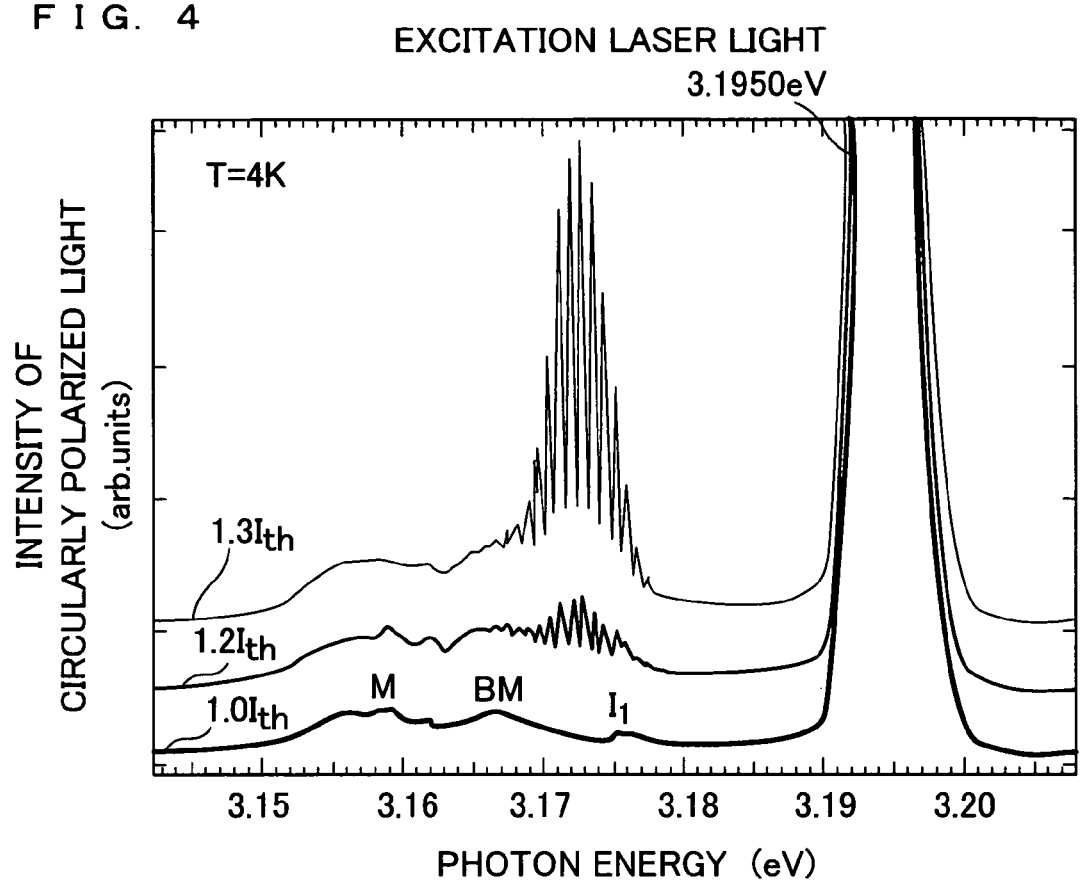
FIG. 4 is a graph showing an observation result of the observation of light emission, which experiment conducted using the laser members fabricated in the example of the present invention.

FIG. 4 illustrates the dependency, of the light emission under the two-photon resonant excitation of biexcitons, on the excitation intensity. In the figure, "M" and "BM" in FIG. 4 are respectively light emissions from the biexcitons and bound biexcitons as illustrated in FIG. 5.

Figure 5:
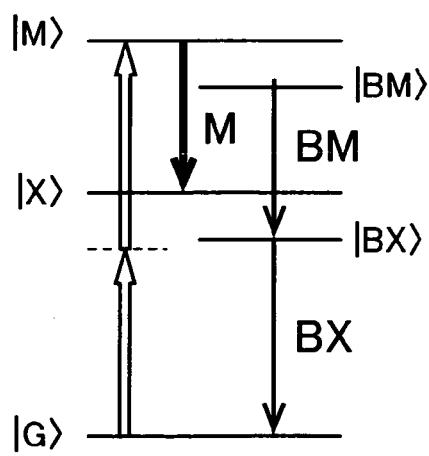
FIG. 5 is an energy band diagram showing an excitation process and a light emission process in a semiconductor quantum dot.

In FIG. 5, "$|G>$" is the ground state, "$|X>$" is the exciton state, "$|M>$" is the biexciton state, "$|BX>$" is the bound exciton state, and "$|BM>$" is the bound biexciton state. Further, "$I_1$" in FIG. 4 is light emission by defect-bound excitons.

A grid of actual crystal is often misaligned in various manners due to defects and/or impurity. As such, in many cases, an exciton is trapped nearby the locally misaligned portion of the grid, and is turned into a bound exciton. Similarly, in many cases, a biexciton in the actual crystal is turned into a bound biexciton. Accordingly, light is emitted not only from the biexciton, but also from the bound biexciton, as illustrated in FIG. 4 and FIG. 5.

By the intensity of excitation light surpassing a lasing threshold value $I_{th}$, spike-like spectra were observed and lasing from the laser member 11 was confirmed (See FIG. 4). The lasing threshold value $I_{th}$ in this case was 67 MW/cm². FIG. 4 shows cases where the intensity of the excitation light was increased by 1.0 times; 1.2 times; and 1.3 times with respect to the lasing threshold value $I_{th}$. As shown, by increasing the intensity of the excitation light, light emitting lasing was observed.

When the pulse width of the excitation laser light is varied to 200 fs, the lasing threshold value $I_{th}$ of the excitation light intensity dropped to 7.5 MW/cm$^2$ (not shown).

Whether or not the end surfaces (cleavage surfaces) of the laser member 11 have the reflection function of a resonator was confirmed as follows. Namely, samples A to C of the laser member 11 were manufactured. The thickness (the thickness in the normal direction A of FIG. 1) of the samples were made different from one another. Then, an actually measured thickness (crystal thickness) of the laser member 11 was compared with a calculated thickness (crystal thickness), of the laser member 11, which had been calculated out on the basis of a lasing mode distance. The relationship between the mode distance Δ and the thickness of the laser member 11 is expressed by the formula (I) below.

$$\Delta v = c/(2nl) \quad (1)$$

In the above formula, "c" is a light speed, and "n" is a refraction index of the laser member 11, and n=1.59.

The results are shown in FIGS. 6 and 7. Note that the mode distance Δv in FIG. 7 is a mode distance calculated out based on a spectrum of FIG. 6. FIG. 7 shows that the actually measured thickness of the laser member 11 and the thickness calculated out based on the mode pitch substantially coincide with each other. Based on this finding, it was confirmed that the end surfaces of the laser member 11 have the reflecting function of a resonator.

The reflectance of the end surfaces of the laser member 11 is only 5%, approximately. As such, lasing hardly occurs in a portion of the end surfaces, in which portion the surface condition is not very good. As matter of fact, in the laser member 11, both: (i) a portion in which lasing occurred, and (ii) a portion in which no lasing but mere light emission occurred, have been observed.

FIG. 8 shows a transition of the intensity I of the light emission in relation to the intensity P of the excitation light. Each triangles indicates a peak intensity of the lasing, and each symbol "+" indicates the peak intensity of the mere light emission. While the lasing occurs, the intensity I is proportional to the intensity P to the $10^{th}$ power. On the other hand, the intensity I is proportional to the intensity P to the $2^{nd}$ power, while the mere light emission occurred without the lasing.

Laser light whose photon energy is 3.1950 eV was used as the excitation laser light to induce light emission, and it is confirmed whether or not the light emission was due to the two-photon resonant excitation of biexcitons, as follows.

The total angular momentum of the biexcitons in CuCl is zero, and therefore two-photon resonance absorption does not occur if circularly polarized excitation laser light is used (See FIGS. 9(a) and 9(b)). As such, if the light emission is due to the two-photon resonant excitation of biexcitons, the light emission will occur while linearly polarized excitation laser light is used, and no light emission will occur while using circularly polarized excitation laser light.

Figure 10:
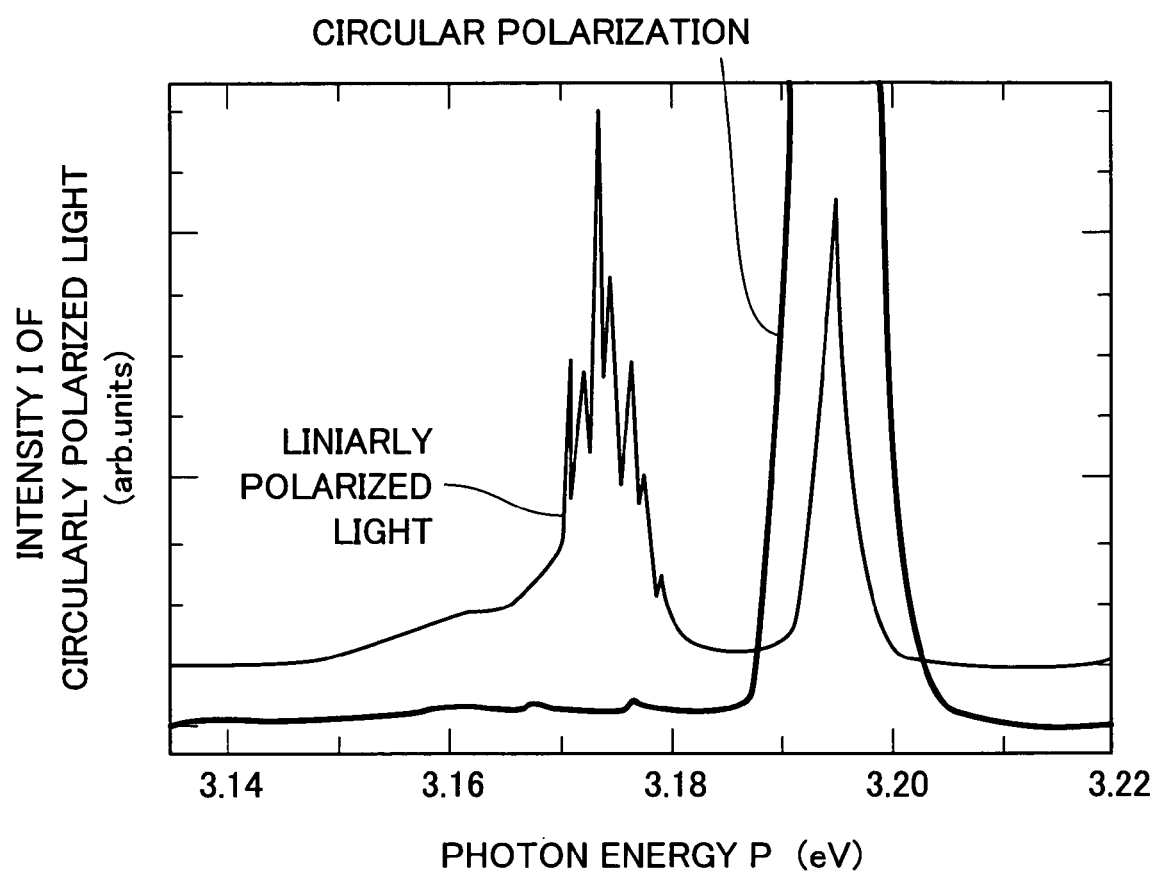
FIG. 10 is a graph showing luminescence spectra in a case of using linearly polarized excitation light and a case of using circularly polarized excitation light.

FIG. 10 indicates an luminescence spectrum observed in a case of using linearly polarized excitation laser light, and an emission spectrum observed in a case of using circularly polarized excitation laser light. From FIG. 10, it is confirmed that the light emission occurs when linearly polarized excitation laser light is used, and the light emission does not occur when circularly polarized excitation laser light is used. Thus, it is confirmed that the light emission induced by using the excitation laser light of 3.1950 eV in photon energy is induced by two-photon resonant excitation of biexcitons.

Further, for the purpose of studying a relationship between (i) photon energy of excitation laser light and (ii) two-photon resonant excitation of biexcitons and one-photon excitation, the photon energy of excitation laser light was varied to find out which one of the excitations occurs at what photon energy.

In FIG. 11, actual measurement values are plotted. The vertical axis is a ratio of emission intensity obtained when linearly polarized excitation laser light is used, and that obtained when circularly polarized excitation laser light is used. The horizontal axis is the variation in the photon energy of the excitation laser light. From FIG. 11, it is found that the efficiency in excitation by using circularly polarized light is considerably reduced on the lower-energy side, close to the exciton energy (3.207 eV) in the bulk crystal of CuCl: i.e. at the boundary of the lower energy end of the one-photon absorption band. As such, it is obvious that a two-photon resonance band of biexcitons exist on the lower-energy side of the one-photon absorption band.

In FIG. 12, the present example is compared with the conventional art disclosed in non-patent document 3. The main distinctions between them are as follows.

In the conventional art, the lasing is due to band-to-band excitation, while the lasing in the present example is due to two-photon resonant excitation of biexcitons. As such, the energy of the excitation laser light used in the present example is lower than that of the conventional art. In other words, the energy of the excitation laser light used in the present example corresponds to the two-photon resonant excitation of biexcitons, and is on the lower-energy side of the band-end (fundamental absorption end).

The biexciton state caused by the two-photon resonant excitation of biexcitons restrains Auger process (nonradiation process) which takes place in excitation of the exciton absorption band, and in one-photon excitation of excitons described in "Comparison Example" below. Thus, a larger number of biexcitons contributes to light emission. This allows for realization of efficient lasing.

Furthermore, the pulse of the excitation laser light used in the conventional art is a pulse of nano second order (i.e., nanosecond pulse), while the pulse of the excitation laser light used in the present example is a pulse of a pico second order (i.e., picosecond pulse) or a pulse of femto second order (i.e., femtosecond order). In the case of using the nanosecond pulse, excitation and light emission are repeated in one pulse cycle. On the other hand, since the decay time of biexciton is approximately several tens pico seconds, it is almost only excitation which occurs in one pulse cycle, in the case of using the picosecond pulse or the femtosecond pulse. As such, biexcitons are generated at once, and completely inverted population is easily realized. The reason for this is as follows. Namely, the decay time of an exciton, which time occurs in the process of light emission from biexciton, is longer than that of biexciton, and the decay time of the exciton is approximately several hundreds pico seconds. Therefore, the use of nanosecond pulse causes energy reabsorption which causes the exciton state to become the initial state, and cause a transition from the exciton state to the biexciton state. Accordingly, with the use of picosecond pulse or femtosecond pulse, highly-efficient two-photon resonant excitation of biexcitons is realized. This allows reduction of lasing threshold $I_{th}$.

In regard to actual measurement values indicated FIG. 12, the lasing threshold value $I_{th}$ indicates peak values (peak energy) with the unit of W/cm$^2$. By comparing the peak values of the present example with the conventional art, it is evident that the present example resulted in higher lasing threshold value $I_{th}$ than the conventional art.

This is believed to be attributed to: (i) the end surfaces of the laser member 11 of the present example, which surfaces have the reflecting function of a resonator; (ii) low reflectance R of 5% of the end surfaces; and (iii) a low Q-factor of 13,400. As in the conventional art, a resonator can be configured in the present example by using a dielectric mirror. Doing so improves the reflectance R up to 90%, and the Q-factor by at least one order of magnitude. This also allows reduction of the lasing threshold value $I_{th}$ by approximately one order of magnitude. Thus, the use of picosecond pulse results in an lasing threshold value $I_{th}$ which is similar to that of the conventional art, and the use of the femtosecond pulse results a lasing threshold value $I_{th}$ which is approximately ⅓ of the conventional art.

Further, in regard to the actual measurement values, the values indicated in FIG. 12 with the unit of "J/cm2" is an amount of energy of each pulse; i.e., an amount of energy to be injected. By comparing these values between the present example and the conventional art, it is found that the present example enables lasing with an amount of energy which is remarkably lower than the conventional art. As described, the present example realizes lasing which is extremely high in energy-efficiency when compared to the conventional art, even if a low reflectance resonator is used.

COMPARISON EXAMPLE

The above example deals with lasing by the two-photon resonant excitation of biexcitons. The present Comparison Example describes one-photon excitation of excitons.

As indicated in FIG. 11, by raising the photon energy of the excitation laser light, a change from the two-photon resonant absorption to the one-photon absorption is observed on the border nearby 3.207 eV. In view of that, in the present Comparison Example, the photon energy of the excitation laser light is modified to 3.229 eV which corresponds to the one-photon excitation of excitons, and light emission by the one-photon excitation of the excitons is observed.

Figure 13:
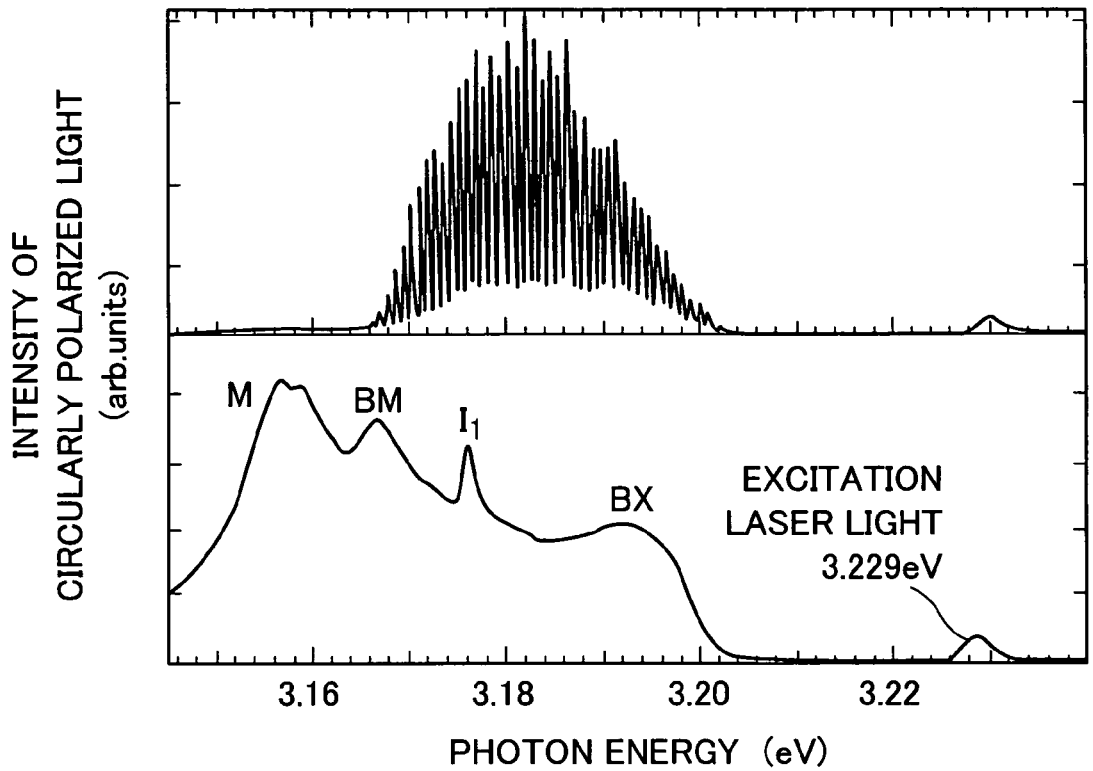
FIG. 13 is a graph showing observation result of observation of the light emission conducted for a purpose of comparison with the present invention.
Figure 14:
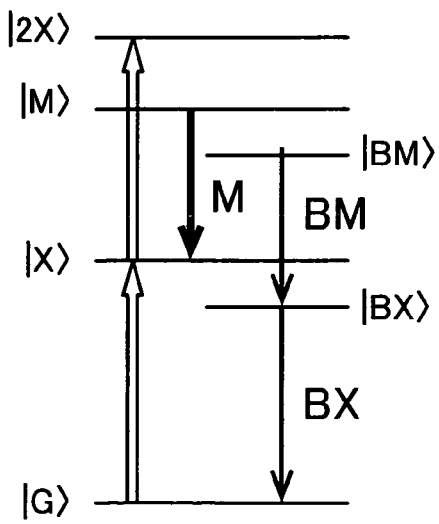
FIG. 14 is an energy band diagram showing an excitation process and a light emission process in a semiconductor quantum dot.
Figure 17:
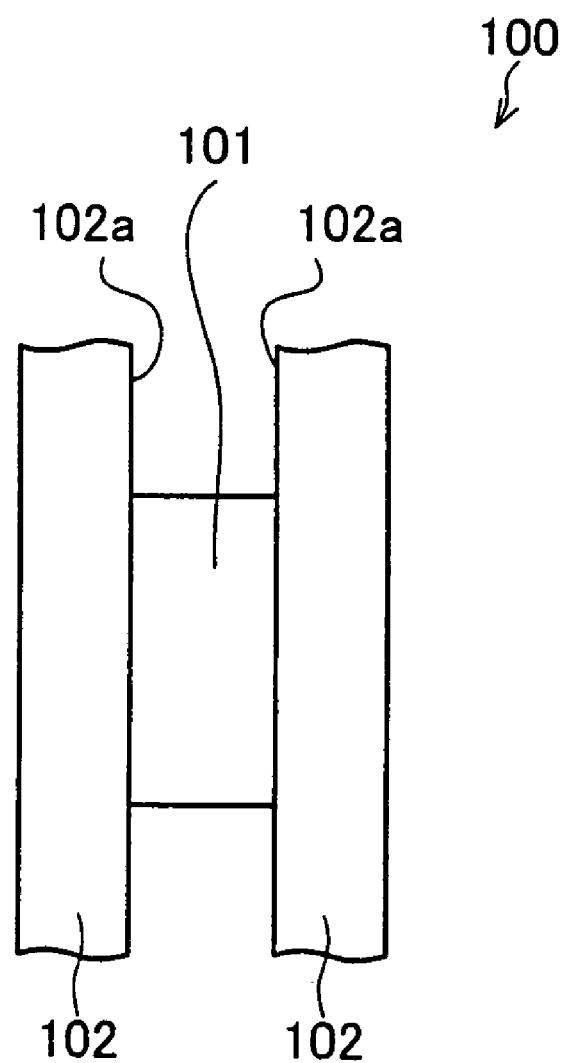
FIG. 17 is a plane view illustrating a configuration of a conventional laser.
Figure 18:
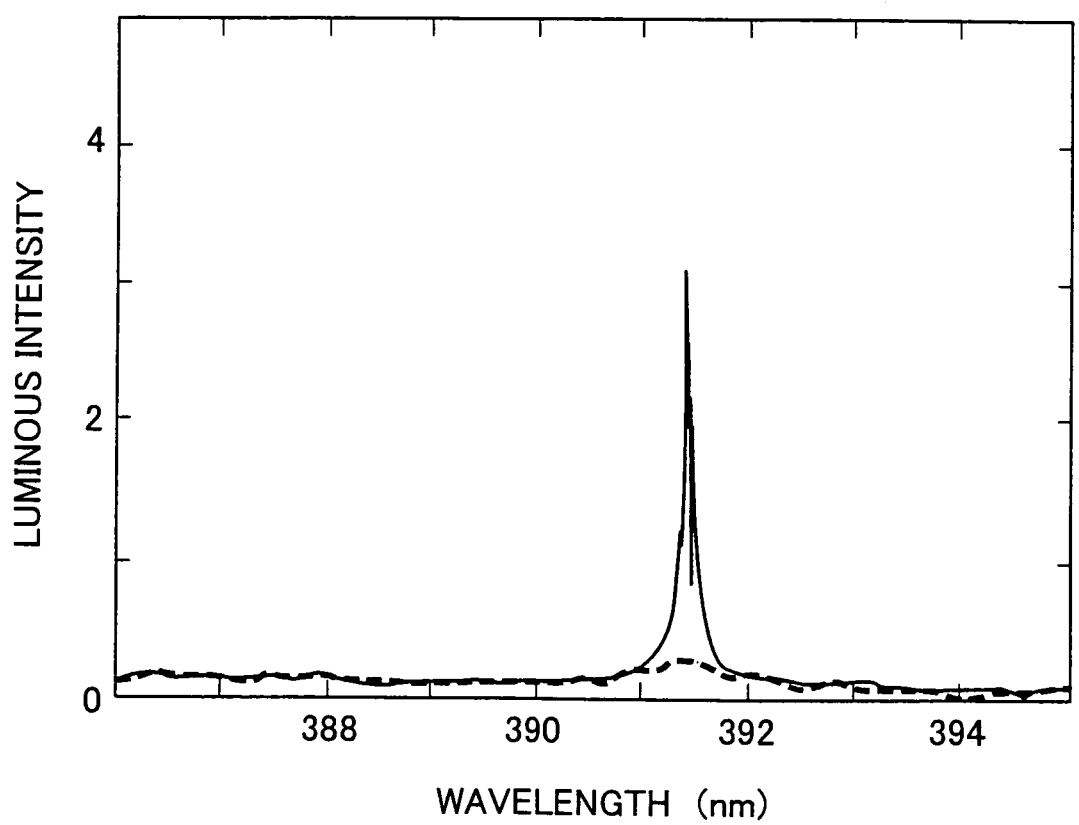
FIG. 18 is a graph showing an observation result of light emission by conventional lasing.

FIG. 13 indicates luminescent spectra under one-photon excitation of excitons. The upper and lower stages respectively indicates (i) a case where lasing takes place, and (ii) a case where no lasing is taking place, and mere light emission is taking place. Further, FIG. 14 shows bands of one-photon excitation of excitons. Here, the symbols "M", "BX", and "BM" in FIG. 13 are respectively light emission from excitons, light emission from bound biexcitons, and light emission from bound excitons, as illustrated in FIG. 14. Further, the symbol "I1" in FIG. 13 is light emission induced by defect-bound excitons. Furthermore, in FIG. 14: "|G>" is the ground state; "|X>" is the exciton state; "|2X>" is a state where two free excitons not being bound to each other are generated; "|M>" is the biexciton state; "|BX>" is the bound exciton state; and "|BM>" is the bound biexciton state.

As shown in FIG. 13, lasing by one-photon excitation of excitons was observed in a wide wavelength band ranging from the bound exciton state to the bound biexciton state. However, the duration of lasing under the one-photon excitation of excitons was several seconds, while the lasing stably lasted one hour or longer under the two-photon resonant excitation of biexcitons. This is attributed to the following reasons described with reference to FIGS. 15(a), 15(b), 16(a) and 16(b).

As illustrated in FIG. 15(a), the two-photon resonant excitation of biexcitons directly generates one biexciton EM in each semiconductor quantum dot QD. This biexciton EM repetitively returns to the ground state with light emission. The repetition of this motion in which the biexciton returns to the ground state enables continuation of stable lasing. On the other hand, as illustrated in FIG. 15(b), the one-photon excitation of excitons generates 2 to 3 excitons EX in each semiconductor quantum dot QD. These excitons interact with each other as illustrated in FIGS. 16(a) and 16(b), thereby causing Auger ionization of the semiconductor quantum dots QD. More specifically, when the electron and the hole are recombined, the energy is transferred to another electron or hole without releasing a photon, in which case the electron or hole to which the energy has been transferred is released from the semiconductor quantum dot QD. This causes ionization of the semiconductor quantum dot QD. It is difficult to induce light emission from the ionized semiconductor quantum dot QD due to Stark effect. As such, it is believed that nonradiation process increases, and the lasing therefore lasts only a short period.

The above described direct generation of the biexcitons is realized by using excitation laser light whose energy is equivalent to half of the energy gap between the ground state ("|G>" of FIG. 5) and the biexciton state (|M> of FIG. 5). Aforementioned example adopts this biexciton direct generation process, and prevents lasing from being stopped due to Auger process which occurred in the present Comparison Example.

[Alternative Form]

In the above example, the laser member 11 is such that the base material is NaCl, and the semiconductor quantum dots embedded in the base material is CuCl. However, the laser member 11 is not limited to this.

Various crystals or various kinds of glass can be chosen as the base material of the laser member 11, provided that the base material of the laser member 11 is transparent with respect to the luminescence wavelength of the semiconductor quantum dots embedded therein.

The material of the semiconductor quantum dots of the laser member 11 is not limited, provided that the biexciton state exist in the material. This requirement, however, is satisfied by most compound semiconductors.

The combination of the base material and the semiconductor quantum dots of the laser member 11 is not limited provided that semiconductor quantum dots are stably embedded. Specifically, it is suitable to select glass or alkali halide crystal as the base material, and select as the semiconductor quantum dots any one of CuCl, CuBr, CdSe, CdS, CuClxBr1-x, CdxSe1-x and ZnO. Further, it is also suitable to adopt as the base material GaAs crystal, AlGaAs crystal, InGaAs crystal or GaAsSb crystal, and to adopt as the semiconductor quantum dot one of InAs or InGaSb: i.e., GaAs structure.

Note that it is particularly preferable to use a pico-second pulse in the GaAs structure having small amount of biexciton binding energy, on the ground of the following reasons. Namely, the spectrum width of ultrashort-pulse laser is in inverse proportion to the pulse width of the laser. As such, the spectrum width of a picosecond pulse is narrower than that of a femtosecond pulse. Furthermore, since the biexciton binding energy in the GaAs structure is small, photon energy for causing the one-photon excitation of excitons, and photon energy for causing two-photon resonant excitation of biexcitons are close to each other. Accordingly, it is preferable to use picosecond pulses having narrower spectrum width, so as to selectively use the two-photon resonant excitation of biexcitons.

The size and shape of the semiconductor quantum dots are not particularly limited. Changing of the size of the semiconductor quantum dots, in particular, enables changing of oscillation wavelength.

Further, in the foregoing example, the cleaved surfaces of the NaCl (base material of laser member 11) serve as the resonator 14 of FIG. 1. However, it is possible to adopt a dielectric mirror as is the case of the conventional art.

Further, instead of separately providing a resonator 14 for the laser member 11, the laser member 11 may be provided with a resonating function as follows. Namely, a laser member 11 having the resonating function is realized by: (i) adopting as the base material a minute sphere of approximately several μm in radius, which globe is made of glass or the like, and (ii) embedding semiconductor quantum dots inside the base material or on the surface thereof. This enables the laser member 11 itself to function as a resonator whose Q-factor is high. The resonation mode in this configuration is so-called Whispering Gallery Mode in which light is multi-reflected and travels in the equator direction of the surface while being confined. Note that the base material may have a disk-like shape instead of a minute spherical shape.

In the foregoing example, the excitation laser light is used as the excitation light for inducing excitation. However, the excitation light does not necessarily have to be laser light. Note, however, that laser light is preferable on the ground that excitation light of high-energy density is easily obtained.

The excitation light is not limited as long as its photon energy (wavelength) is suitable for the two-photon resonant excitation of biexcitons. Further, excitation light having wide spectrum width allows lasing in wider band, accordingly.

The pulse width of the excitation light is preferably picosecond order (less than $1\times10-9$, not less than $1\times10-12$). It is particularly preferable to adopt the pulse width of femtosecond order (less than $1\times10-12$, not less than $1\times10-15$), on the ground that the lasing threshold value is significantly reduced. However, the pulse width of the excitation light is not limited to these, and the lasing threshold value could be reduced even by adopting the pulse width of nanosecond order.

APPLICATION EXAMPLE

The laser 10 of the present embodiment realizes lasing at a wavelength which is close to the wavelength of the excitation light. Further, the laser 10 allows relatively broad distribution of the sizes of the semiconductor quantum dots in the laser member 11, and the lasing in the wide wavelength band is possible according to the wide distribution of the sizes.

By utilizing this advantage, the laser 10 can be used as a wavelength converting element or an amplifying element for use in optical communications or the like. More specifically, with the laser 10, it is possible to realize a wavelength converting element which covers the entire communications wavelength bands of 1.3 μm to 1.6 μm. Note that a laser member 11 whose base material is GaAs crystal, AlGaAs crystal, or GaAsSb crystal is believed to be suitable for realizing lasing in the communications wavelength band.

As described, a laser (lasing device) 10 of the present invention is a laser device for causing lasing by using a semiconductor quantum dot, including: a laser member 11 in which said semiconductor quantum dot is formed; a resonator (resonating section) 14 for resonating light generated in the laser member 11; and a pump laser (excitation light source section) 15 for irradiating the laser member with excitation light whose energy corresponds to two-photon resonant excitation, so as to form a biexciton state in the semiconductor quantum dot by the two-photon resonant excitation.

Further, a lasing method of the present invention is a lasing method which causes lasing by using a semiconductor quantum dot, including the step of: forming a biexciton state in the semiconductor quantum dot by two-photon resonant excitation, so as to cause lasing by inducing light emission from the semiconductor quantum dot. The biexciton state is formed by the two-photon resonant excitation in the semiconductor quantum dots, by irradiating the semiconductor quantum dot with the excitation light whose energy corresponding to the two-photon resonant excitation.

In the above configuration and the method, the biexciton state is formed in the semiconductor quantum dot, so as to cause lasing by inducing light emission. Further, the excitation by two-photon resonant excitation (two-photon resonant excitation of biexcitons) is performed to form the biexciton state.

The formation of the biexciton state by the two-photon resonant excitation of biexcitons restrains Auger process (i.e. nonradiation process) which occurs in excitation of an exciton absorption band or in one-photon excitation of excitons.

As such, a larger number of biexcitons contributes to the light emission. As the result, it is possible to realize lasing which utilizes efficient light emission.

The laser device or the lasing method of the present invention is preferably adapted so that a continuous irradiation period of the excitation light is of the order of picoseconds or femtoseconds.

The decay time of biexcitons is of the order of several tens picoseconds. Therefore, by regulating the continuous irradiation period of the excitation light as described above, almost only the excitation takes place in the continuous irradiation period. This allows biexcitons to be generated at once, and allows easy formation of completely inverted population. The reason for this is as follows. Namely, the decay time of an exciton, which time occurs in the process of light emission from biexciton, is longer than that of biexciton, and the decay time of the exciton is approximately several hundreds pico seconds. Therefore, an irradiation period which is longer than one nanosecond causes energy reabsorption which causes the exciton state to become the initial state, and causes a transition from the exciton state to the biexciton state. Accordingly, it is possible to more efficiently realize two-photon resonant excitation of biexcitons. This also allows reduction of the lasing threshold value consequently.

Note that the above regulation of the continuous irradiation period is possible by modulating excitation light to be irradiated into excitation light of picosecond pulse or femtosecond pulse excitation light.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

As described, in a laser device and lasing method of the present invention, a biexciton state is formed in a semiconductor quantum dot, so as to cause lasing by inducing light emission. Further, the excitation by two-photon resonant excitation (two-photon resonant excitation of biexcitons) is performed to form the biexciton state.

The formation of the biexciton state by the two-photon resonant excitation of biexcitons restrains Auger process (i.e. nonradiation process) which occurs in excitation of an exciton absorption band or in one-photon excitation of excitons.

As such, a larger number of biexcitons contributes to the light emission. As the result, it is possible to realize lasing which utilizes efficient light emission.

The present invention is applicable as a wavelength converting element or an amplifying element for use in optical communications or the like.

The invention claimed is:

1. A laser device for causing lasing by using one or more semiconductor quantum dots, comprising
    a laser member in which said one or more semiconductor quantum dots are formed;
    a resonating section for resonating light generated in the laser member; and
    an excitation light source section for irradiating the laser member with excitation light whose energy corresponds to two-photon resonant excitation, so as to directly form, without going through an intermediary of exciton state, a biexciton state in at least one of the one or more semiconductor quantum dots by the two-photon resonant excitation.

2. The laser device as set forth in claim 1, wherein
    a continuous irradiation period in which said excitation light source section continuously irradiates the laser member with excitation light is of the order of picoseconds.

3. The laser device as set forth in claim 1, wherein
    a continuous irradiation period in which said excitation light source section continuously irradiates the laser member with excitation light is of the order of femtoseconds.

4. The laser device as set forth in claim 1, wherein said laser member includes the one or more semiconductor quantum dots and a base material retaining the one or more semiconductor quantum dots; said one or more semiconductor quantum dots are made of any one of CuCl, CuBr, CdSe, CdS; and said base material is made of glass or alkali halide crystal.

5. The laser device as set forth in claim 1, wherein said laser member includes the one or more semiconductor quantum dots and a base material retaining the one or more semiconductor quantum dots; said one or more semiconductor quantum dots are made of InAs or InGaSb; and said base material is made of GaAs.

6. A lasing method which causes lasing by using one or more semiconductor quantum dots, comprising the step of:
    directly forming, without going through an intermediary of exciton state, a biexciton state in at least one of the one or more semiconductor quantum dots by two-photon resonant excitation, so as to cause lasing by inducing light emission from the at least one of the semiconductor quantum dots.

7. The lasing method as set forth in claim 6, wherein said biexciton state in the one or more semiconductor quantum dots are formed by irradiating the one or more semiconductor quantum dots with excitation light whose energy corresponds to said two-photon resonant excitation.

8. The lasing method as set forth in claim 7, wherein
    a continuous irradiation period of said excitation light is of the order of picoseconds.

9. The lasing method as set forth in claim 7, wherein
    a continuous irradiation period of said excitation light is of the order of femtoseconds.

* * * * *

UNITED STATES PATENT AND TRADEMARK OFFICE
CERTIFICATE OF CORRECTION

| | | |
|---|---|---|
| PATENT NO. | : 8,175,132 B2 | Page 1 of 1 |
| APPLICATION NO. | : 10/589243 | |
| DATED | : May 8, 2012 | |
| INVENTOR(S) | : Itoh et al. | |

It is certified that error appears in the above-identified patent and that said Letters Patent is hereby corrected as shown below:

Title Page,

Item (86) should read, PCT No.: PCT/JP2004/011536

Signed and Sealed this
Fourteenth Day of August, 2012

David J. Kappos
*Director of the United States Patent and Trademark Office*